(12) United States Patent
Kuo et al.

(10) Patent No.: US 6,421,267 B1
(45) Date of Patent: Jul. 16, 2002

(54) MEMORY ARRAY ARCHITECTURE

(75) Inventors: Nai-Ping Kuo; Hsin-Yi Ho; Chun-Hsiung Hung; Ho-Chun Liou, all of Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/840,709

(22) Filed: Apr. 24, 2001

(51) Int. Cl.[7] .............................................. G11C 11/34
(52) U.S. Cl. ........................................... 365/63; 365/51
(58) Field of Search ...................... 365/63, 51; 257/322, 257/316

(56) References Cited

U.S. PATENT DOCUMENTS 5,557,124 A * 9/1996 Roy et al. .................. 257/322
5,590,068 A * 12/1996 Bergemont .................. 365/63
5,973,691 A * 10/1999 Park et al. .................... 365/63
6,285,574 B1 * 9/2001 Eitan ............................ 365/62

* cited by examiner

Primary Examiner—Son T. Dinh
(74) Attorney, Agent, or Firm—Powell, Goldstein, Frazer & Murphy, LLP

(57) ABSTRACT

A memory array architecture includes a plurality of memory cells formed into rows and columns. A plurality of bit lines is connected to the memory cells through select transistors. By disposing adjacent bit lines into different metal layers or alternatively interlocating adjacent bit lines, the coupling effect between bit lines can be effectively reduced, and thus can improve reading speed of memory while performing read operation.

15 Claims, 5 Drawing Sheets

MEMORY ARRAY ARCHITECTURE

FIELD OF THE INVENTION

The present invention relates to a semiconductor memory, and more particularly to a memory array architecture which can reduce the coupling effect between bit lines and improve the performance of memory.

BACKGROUND OF THE INVENTION

Memory arrays are well known in the art and comprise matrices of memory cells organized into rows and columns. Each memory cell (or called memory transistor) comprises a gate, a source and a drain, each of which has to receive voltage in order for the cell to be accessed. Columns of sources and columns of drains are connected together by bit lines while rows of gates are connected together by word lines. To activate a cell, one word line, one source bit line and one drain bit line must receive voltage.

Various memory array architectures are developed which reduce the size of the memory array area by reducing the number of metal lines. In virtual ground architectures, the common ground line is eliminated. Instead, the drain of one cell serves as the source for its neighboring cell. To further reduce array size, the alternate metal virtual ground architecture (AMG), disclosed in U.S. Pat. No. 5,204,835, uses two bit lines per metal line. Typically, in the AMG architecture, the cell size is close or equal to the minimum feature size possible for the cell.

In the array architecture with such high integration, the distance between two adjacent bit lines is close or equal to the critical dimension of semiconductor process. As the critical dimension is scaled down under 0.18 µm, inductive-capacitive coupling effect will be occurring because of short distance between adjacent bit lines, and thereby prolongs time of memory read operation or causes an error signal occur, which results in a data accessing error.

Referring to FIG. 4a, during reading operation of memory, bit line BL is pulled to high voltage level after address transition detection (ATD). However, signal sense line SENSEB must wait the bit line BL to be ready and stable, and then be shifted to low voltage level to start select line SL. This will increase reading time as accessing storage data, and read performance of memory will be therefore decreased.

Referring to FIG. 4b, since the voltage on the select line SL is about several tens mV, the voltage on the select line SL will be disturbed by coupling effect of bit lines if signal sense line SENSEB is shifted to low voltage level when the bit line BL is still unready or non-stability. Little change of voltage on the select line SL will cause the sense amplifier sensing error, and data "0" or "1" stored in the memory cell will be read error. Hence, above-mention cases both heavily affect the working range of sense amplifier on the select line SL.

SUMMARY OF THE INVENTION

Therefore, the present invention provides a memory array architecture, which can effectively improve the coupling effect between bit lines, and hence, increase sense accuracy and data reading speed.

The present invention provides a memory array architecture of which comprises a plurality of memory cells. A plurality of select transistors including upper and lower block select transistors is connected to the memory cells. A plurality of bit lines is connected to the select transistors, wherein odd bit lines connected to the upper block select transistors are located in a first metal layer, and even bit lines connected to the lower block select transistors are located in a second metal layer. Adjacent bit lines are in different metal layers. The memory cells can be selected from the following types of memory cells: read only memory (ROM), programmable read only memory (PROM), erasable programmable read only memory (EPROM), electrically erasable programmable read only memory (EEPROM), Flash EEPROM, nitride ROM (NROM), dual bit ROM and dual bit NROM.

The present invention also provides a memory array architecture of which comprises a plurality of memory cells. A plurality of select transistors, which including first upper and lower block select transistors, and second upper and lower block select transistors, is connected to the memory cells. First, second, third and fourth bit lines parallel to each other are connected to the select transistors. Wherein, the first and second bit lines are alternatively interlocated between the third and fourth bit lines. The first bit line is connected to the first upper block select transistors. The second bit line is connected to the first lower block select transistors. The third bit line is connected to the second upper block select transistors. The fourth bit line is connected to the second lower block select transistors. The distance between the bit lines of the present invention for memory cell accessing is increased, and the coupling effect between bit lines can be reduced. Therefore, sense time for data reading can be shortened, and sense accuracy also can be improved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a memory array architecture which can reduce coupling effect between bit lines by disposing adjacent bit lines for operating memory cell into different metal layers or alternatively interlocating adjacent bit lines to improve data reading speed of memory cell. The present invention will be further described in the following preferred embodiment.

[First embodiment]

Figure 1:
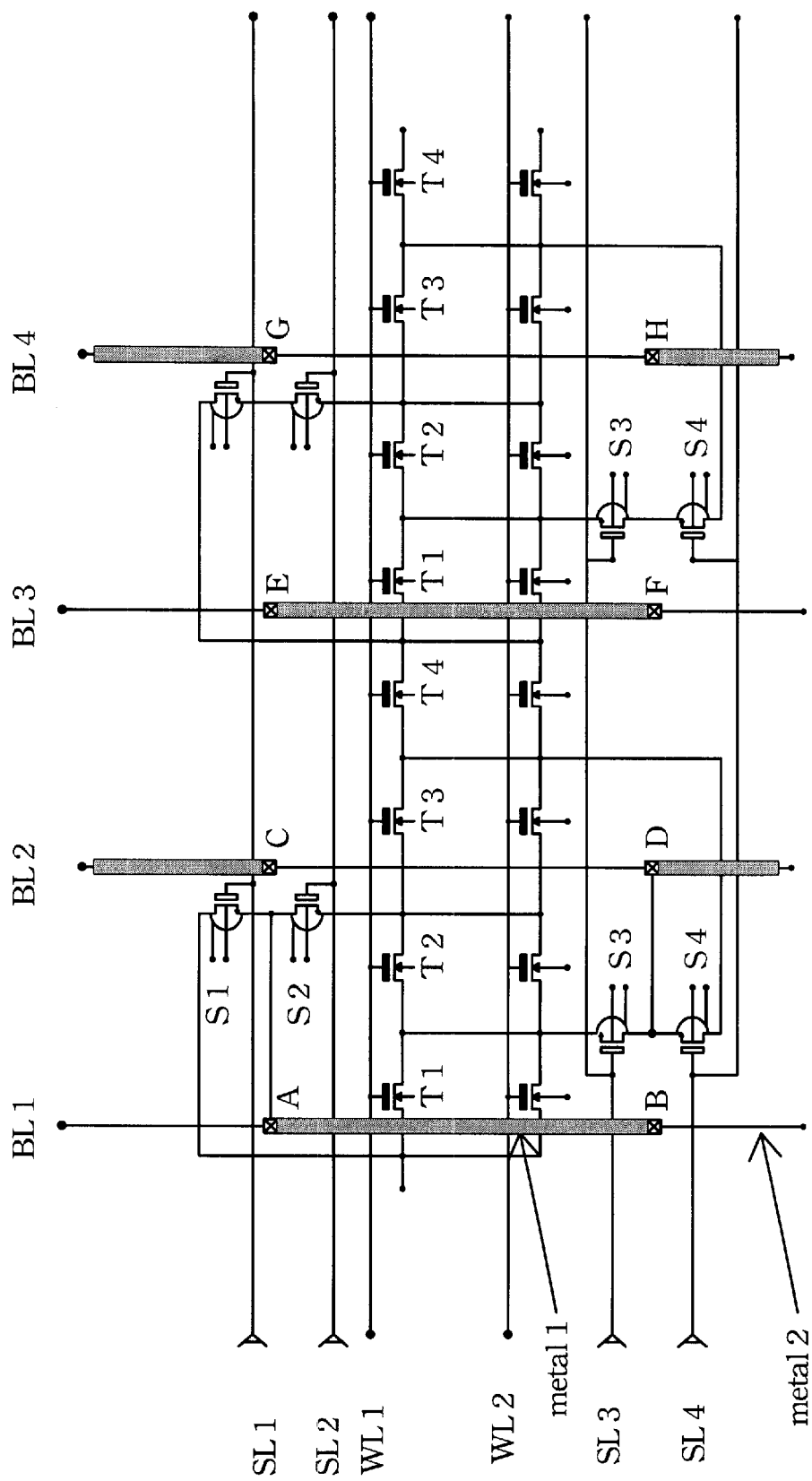
FIG. 1 is a schematic view of the memory array architecture in the first preferred embodiment of the present invention.

Referring to FIG. 1, it is a schematic view of the memory array architecture of the present invention. The memory array of the invention at least comprises two array regions. Each array region includes a memory block having a plurality of memory cells into rows and columns. The memory cells, generally memory transistors, are of one selected from following types of memory cells: read only memory (ROM), programmable read only memory (PROM), erasable programmable read only memory (EPROM), electrically erasable programmable read only memory (EEPROM), Flash EEPROM, nitride ROM (NROM), dual bit ROM and dual bit NROM, as the memory cells T1, T2, T3 and T4 shown in FIG. 1.

As illustrated in FIG. 1, the block above the memory block is defined "upper block", and correspondingly the block below the memory block is defined "lower block". In the upper block, there are upper block select transistors which including a first select transistor S1 and a second select transistor S2. In the lower block, there are lower block select transistors which including a third select transistor S3 and a fourth select transistor S4. Four select lines, i.e. first, second, third and fourth select lines SL1, SL2, SL3 and SL4, are correspondingly connected to the gate terminal of each select transistor.

A plurality of parallel bit lines, as the first, second, third and fourth bit lines BL1, BL2, BL3 and BL4 shown in FIG. 1, are across the memory block. Odd bit lines, e.g., first and third bit lines BL1 and BL3, are respectively connected to a common source/drain terminal of first and second select transistors S1 and S2 of different array regions. That is, the first bit line BL1 is connected to the first and second select transistors S1 and S2 in the first array region. The third bit line BL3 is connected to the third and fourth select transistors S3 and S4 in the second array region. Likewise, even bit lines, e.g. second and fourth bit lines BL2 and BL4, are respectively connected to a common source/drain terminal of third and fourth select transistors S3 and S4.

Another source/drain terminals of the first, second, third and fourth select transistors are respectively connected to the memory cells. Moreover, word lines, e.g., first and second word lines WL1 and WL2, are serially connected to gate terminal of memory cells in each row. Using the memory cell T1 in first array region as an example, the first word line WL1 is connected to the gate terminal of memory cell T1. The "upper" first select transistor S1 is connected to one source/drain terminal of memory cell T1, and the "lower" third select transistor S3 is connected to another source/drain terminal of memory cell T1. The operation mode for reading data storage in memory cell T1 can be the following exemplary method. Typically voltage 2.7–3 V can be applied on the first word line WL1, 1.6–2 V can be applied on the first bit line BL1, 0V can be applied on the third bit line BL2, and standard chip voltage Vcc can be applied on the first and third select lines SL1 and SL3.

In the memory array of the present invention, adjacent bit lines are located in different metal layers. Using the first and second bit lines BL1 and BL2 as an example, between the upper block and lower block, the first bit line BL1 is located in first metal layer, and the second bit line BL2 is located in second metal layer. Of course, the first and second bit line BL1 and BL2 can be located in opposite metal layer. The first bit line BL1 in the first metal layer is connected to the second metal layer through via contacts A and B in the upper and lower block of first array region to connect to peripheral circuit outside the array region. Inversely, The second bit line BL2 in the second metal layer is connected to the first metal layer through via contacts C and D in the upper and lower block of second array region.

Figure 2:
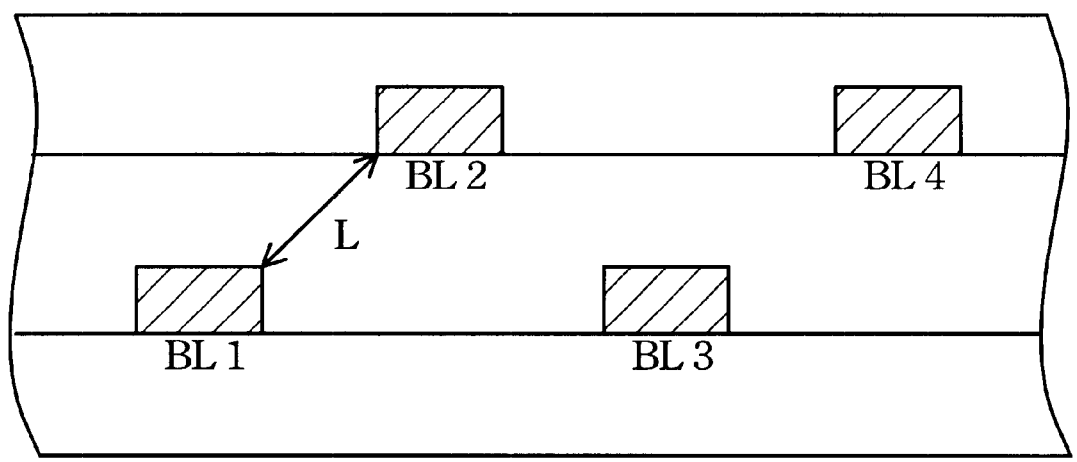
FIG. 2 is a schematic, cross-sectional view corresponding to the memory block of FIG. 1, which illustrates the relative position between two adjacent bit lines.

Referring to FIG. 2, it shows relative position between two adjacent bit lines in the memory block of FIG. 1 is shown. As shown in FIG. 2, the first bit line BL1 is located in the first metal layer, and the second bit line BL2 is located in the second metal layer. First and second interlayer dielectric layer IDL1 and IDL2 are formed to cover the bit lines located in the first and second metal layers to provide electrical isolation between bit lines. Since the first bit line BL1 and second bit line BL2 are located in different metal layer, the distance L between the first and second bit lines BL1 and BL2 are relatively increased. The increased distance L can effectively reduce coupling effect between the first and second bit lines BL1 and BL2.

Figure 5:
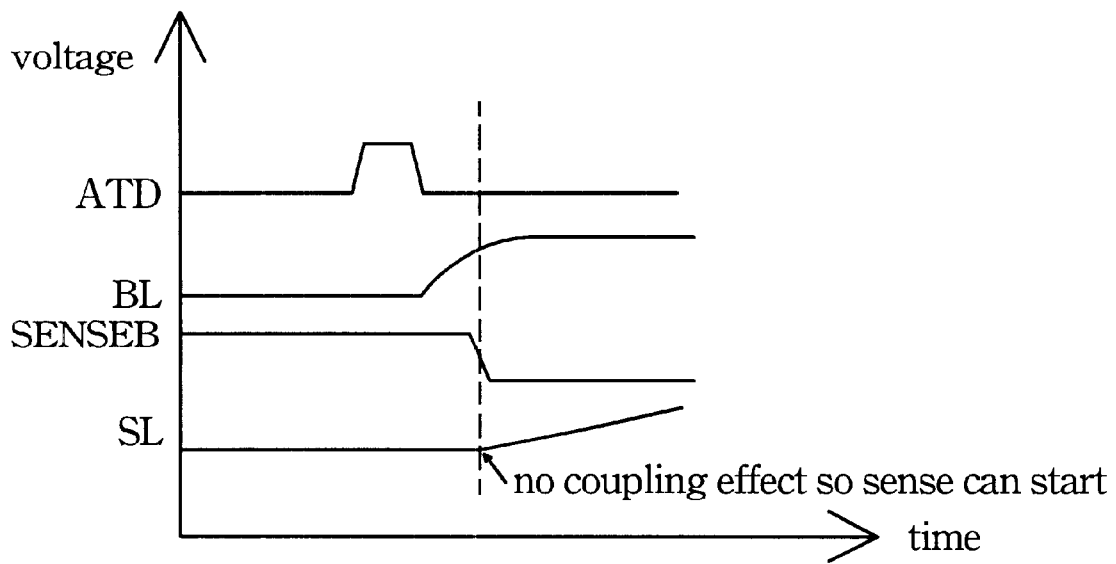
FIG. 5 is functional clock diagram of the memory array architecture of the present invention, which illustrates that sensing of select line can be performed immediately without waiting bit lines ready and there is no sense error occurring.

Referring to FIG. 5, a functional clock diagram of the present invention is shown. During reading operation of memory, after address transition detection (ATD), a reading step is performed to a selected memory cell. The voltage on the bit line corresponding to selected bit line is pulled to a high voltage level from original low voltage level. The signal sense line is then shifted to low voltage level, and the voltage on the select line SL is thereby gradually increased. The data stored in the selected memory cell can be read by sensing the voltage on the select line SL through the sense amplifier (not shown) on the select line SL. Since the adjacent bit lines of the present invention are located in different metal layers, the distance between two the bit lines can be increased. Therefore, the coupling effect between the bit lines can be effectively reduced, and select line SL can perform sense step without waiting for the bit line to become ready during read operation. By shortening the sensing time, read speed can be therefore improved. On the other hand, although the bit line BL is still not ready, the sense amplifier on the select line SL of the present invention can perform sensing step without disturbance from the coupling effect between bit lines, and the data "0" or "1" stored in the selected memory cell can be precisely read.

[Second embodiment]

Another memory array architecture of the present invention will be disclosed in the following description. By alternatively interlocating bit lines, the distance between bit lines for operating memory cell will be increased, and thereby the coupling effect between bit lines can be effectively reduced. Therefore, sense time for data reading can be shortened, and sense accuracy also can be improved.

Figure 3:
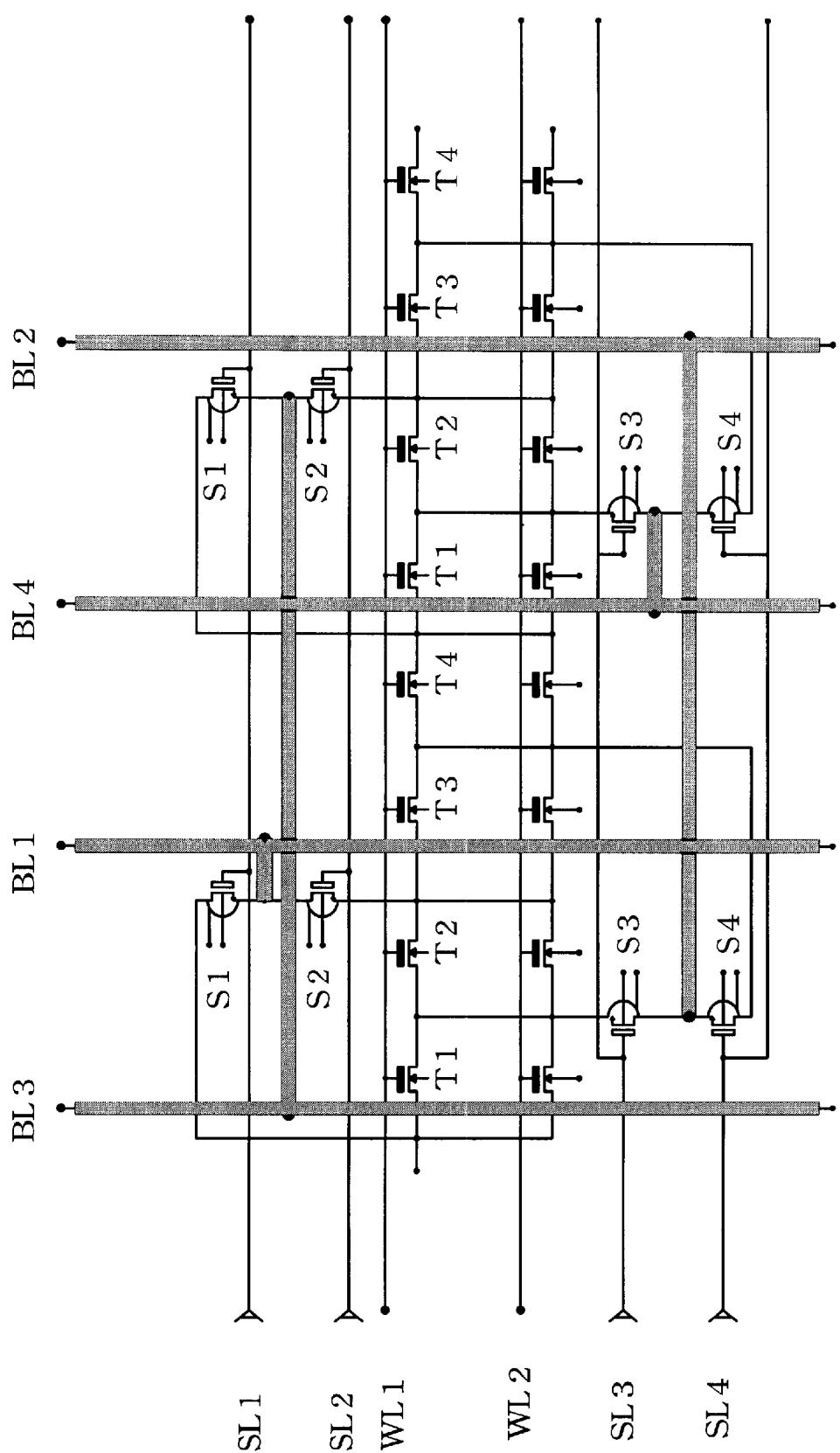
FIG. 3 is a schematic view of the memory array architecture in the second preferred embodiment of the present invention.
Figure 4A:
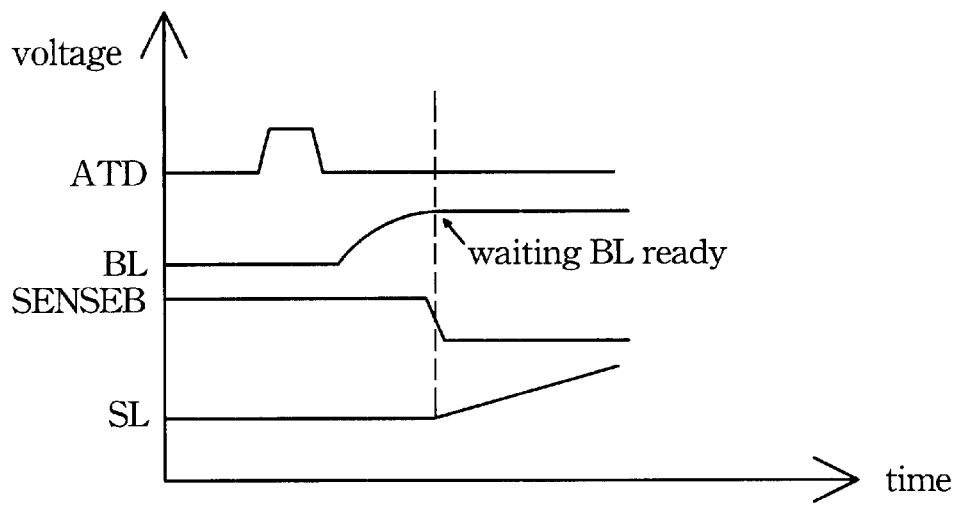
FIG. 4a is a functional clock diagram of the memory array architecture in prior art, which illustrates that sensing of select line must be performed after the bit lines are ready.
Figure 4B:
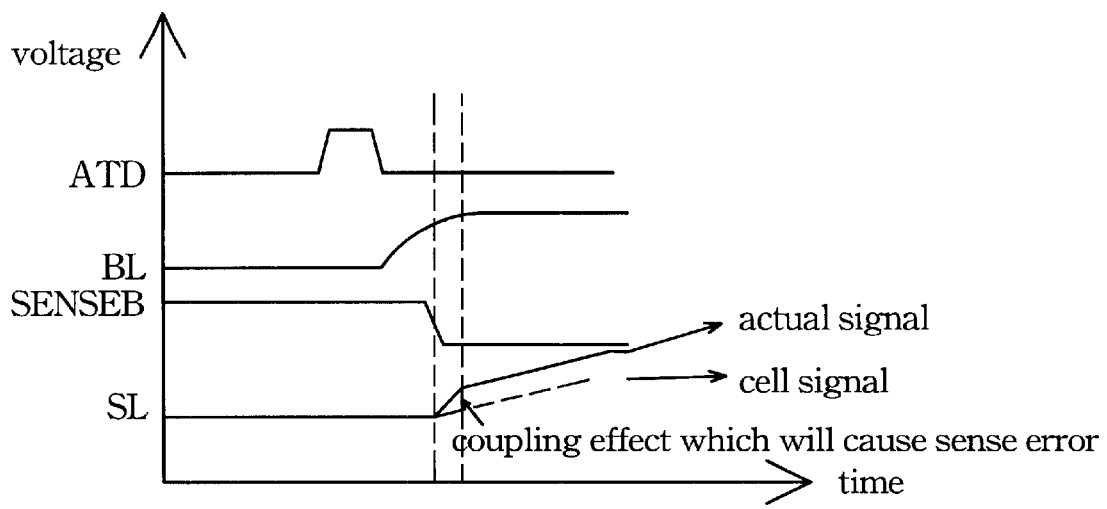
FIG. 4b is a functional clock diagram of the memory array architecture of the prior art, which illustrates sense error resulting by coupling effect between bit lines while sense is forwarded before the bit lines are ready.

Referring to FIG. 3, the memory array architecture in another preferred embodiment of the present invention is shown. The memory array of the invention at least comprises tow array regions. Each array region includes a memory block having a plurality of memory cells into rows and columns. The memory cells, generally memory transistors, are of one selected from following types of memory cells: read only memory (ROM), programmable read only memory (PROM), erasable programmable read only memory (EPROM), electrically erasable programmable read only memory (EEPROM), Flash EEPROM, nitride ROM (NROM), dual bit ROM and dual bit NROM, as the memory cells T1, T2, T3 and T4 shown in FIG. 3.

As illustrated in FIG. 3, the block above the memory block is defined "upper block", and correspondingly the block below the memory block is defined "lower block". In the upper block, there are upper block select transistors which including a first select transistor S1 and a second select transistor S2. Likewise, in the lower block, there are lower block select transistors which including a third select transistor S3 and a fourth select transistor S4. Four select lines, i.e., first, second, third and fourth select lines SL1, SL2, SL3 and SL4, are correspondingly connected to the gate terminal of each select transistor in series.

A plurality of parallel bit lines, as the first, second, third and fourth bit lines BL1, BL2, BL3 and BL4 shown in FIG. 3, are across the memory block. Wherein, the first and second bit lines BL1 and BL2 are alternatively interlocating between the third and fourth bit lines BL3 and BL4. In other words, only one bit line, first bit line BL1 or second bit line BL2, is located between the third and fourth bit lines BL3 and BL4. Moreover, the first bit line BL1 is connected to first upper block select transistors, i.e. upper block select transistors in the first array region. The second bit line BL2 is connected to first lower block select transistors. The third bit line BL3 is connected to second upper block select transistors. The fourth bit line BL4 is connected to second lower block select transistors. That is, the first bit line BL1 is connected to a common source/drain terminal of the first and second select transistors S1 and S2 in the first array region. The third bit line BL3 is connected to a common source/drain terminal of the first and second select transistors S1 and S2 in the second array region. Likewise, the second and fourth bit lines BL2 and BL4 are respectively connected to common source/drain terminals of the third and fourth select transistors S3 and S4 in the first and second array regions.

Another source/drain terminals of the first, second, third and fourth select transistors are respectively connected to the memory cells. Moreover, word lines, e.g. first and second word lines WL1 and WL2, are serially connected to gate terminals of memory cells in each row. Using the memory cell T1 in first array region as an example, the first word line WL1 is connected to the gate terminal of memory cell T1. The "upper" first select transistor S1 is connected to one source/drain terminal of memory cell T1, and the "lower" third select transistor S3 is connected to another source/drain terminal of memory cell T1. The operation mode for reading data storage in memory cell T1 can be the following exemplary method. Typically voltage 2.7–3 V can be applied on the first word line WL1, 1.6–2 V can be applied on the first bit line BL1, 0 V can be applied on the second bit line BL2, and standard chip voltage Vcc can be applied on the first and third select lines SL1 and SL3.

In the memory array of the present invention, adjacent bit lines are alternatively interlocated, so that the distance between bit lines for operating the memory cell is increased. Using the memory cell T1 in first array region as an example, the first and second bit lines BL1 and BL2 are used to operate memory cell T1. One bit line, third bit line BL3 or fourth bit line BL4, is disposed between the first and second bit lines BL1 and BL2. In this case, the distance L between the first and second bit lines BL1 and BL2 can be greatly increased, about two times original distance, without decreasing integration of the integrated circuit, and thereby the coupling effect between the first and second bit lines can be effectively reduced.

Referring to FIG. 5, the operation method in the embodiment is the same as in the first preferred embodiment. On one hand, sensing time can be shortened, and thus reading time can be improved. On the other hand, although the voltage on the bit line is unready of non-stability, the sense amplifier on the select line can sense immediately without coupling effect between bit lines. Therefore, data storage in the memory cell can be precisely read. Details description of operation method has been discussed in the first preferred embodiment. All of which is incorporated herein, and the invention will not discuss furthermore.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A memory array architecture, at least comprising:

a plurality of memory cells;

a plurality of select transistors connecting to the memory cells, wherein the select transistors include upper block select transistors and lower block select transistors; and a plurality of bit lines connecting to the select transistors, wherein odd bit lines connected to the upper block select transistors are located in a first metal layer and even bit lines connected to the lower block select transistors are located in a second metal layer.

2. The memory array architecture according to claim 1, wherein the memory cells are selected from the following types of memory cells: read only memory (ROM), programmable read only memory (PROM), erasable programmable read only memory (EPROM), electrically erasable programmable read only memory (EEPROM), Flash EEPROM, nitride ROM (NROM), dual bit ROM and dual bit NROM.

3. The memory array architecture according to claim 1, wherein the upper block select transistors includes a first select transistor and a second select transistor, and the lower block select transistors includes a third select transistor and a fourth select transistor.

4. The memory array architecture according to claim 3, further comprising first, second, third and fourth select lines connecting to each gate terminal of the corresponding first, second, third and fourth transistors, respectively.

5. The memory array architecture according to claim 3, wherein each odd bit line is connected to one common source/drain terminal of the first and second select transistors, and each even bit line is connected to one common source/drain terminal of the third and fourth select transistors.

6. The memory array architecture according to claim 5, wherein another source/drain terminals of the first, second, third and fourth select transistors are connected to the memory cells.

7. The memory array architecture according to claim 1, further comprising word lines respectively connected gate terminal of each memory cell.

8. The memory array architecture according to claim 1, wherein adjacent bit lines are located in different metal layers.

9. A memory array architecture, at least comprising:

a plurality of memory cells;

a plurality of select transistors connecting to the memory cells, wherein the select transistors include first upper and lower block select transistors, and second upper and lower block select transistors; and first, second, third and fourth bit lines connecting to the select transistors, wherein the first and second bit lines are alternatively interlocated between the third and fourth bit lines, and the first bit line is connected to the first upper block select transistors, the second bit line is connected to the first lower block select transistors, the third bit line is connected to the second upper block select transistors, and the fourth bit line is connected to the second lower block select transistors.

10. The memory array architecture according to claim 9, wherein the memory cells are selected from the following types of memory cells: read only memory (ROM), programmable read only memory (PROM), erasable programmable read only memory (EPROM), electrically erasable programmable read only memory (EEPROM), Flash EEPROM, nitride ROM (NROM), dual bit ROM and dual bit NROM.

11. The memory array architecture according to claim 9, wherein the first and second upper block transistors respectively include a first and a second select transistor, and the first and second lower block transistors respectively include a third and a fourth select transistor.

12. The memory array architecture according to claim 11, further comprising first, second, third, and fourth select lines connecting to each gate terminal of the corresponding first, second, third and fourth transistors, respectively.

13. The memory array architecture according to claim 12, wherein the first and third bit lines are connected to one common source/drain terminal of the first and second select transistors, and the second and fourth bit lines are connected to one common source/drain terminal of the third and fourth select transistors.

14. The memory array architecture according to claim 13, wherein another source/drain terminals of the first, second, third and fourth select transistors are connected to the memory cells.

15. The memory array architecture according to claim 9, further comprising word lines respectively connected gate terminal of each memory cell.

\* \* \* \* \*